(12) United States Patent
Kort et al.

(10) Patent No.: US 11,460,884 B2
(45) Date of Patent: Oct. 4, 2022

(54) CASE FOR PORTABLE COMPUTING DEVICES

(71) Applicant: Byrdbyte Creations Inc., Middletown, DE (US)

(72) Inventors: Kareem Kort, Vienna, VA (US); Emil Fadi Kort, Vienna, VA (US); Maximilian Kent Dykes, London (GB)

(73) Assignee: BYRDBYTE CREATIONS INC., Middletown, DE (US)

( * ) Notice: Subject to any disclaimer, the term of this patent is extended or adjusted under 35 U.S.C. 154(b) by 0 days.

(21) Appl. No.: 17/235,065

(22) Filed: Apr. 20, 2021

(65) Prior Publication Data

US 2021/0240225 A1   Aug. 5, 2021

Related U.S. Application Data

(63) Continuation-in-part of application No. 16/821,113, filed on Mar. 17, 2020.

(60) Provisional application No. 63/016,480, filed on Apr. 28, 2020, provisional application No. 62/854,365, filed on May 30, 2019, provisional application No. 62/796,099, filed on Jan. 24, 2019.

(51) Int. Cl.
   *G06F 1/16*      (2006.01)
   *H01R 13/516*    (2006.01)
   *H05K 5/00*      (2006.01)
   *H01R 13/73*     (2006.01)

(52) U.S. Cl.
   CPC .............. *G06F 1/1628* (2013.01); *G06F 1/16* (2013.01); *G06F 1/1613* (2013.01); *G06F 1/1656* (2013.01); *H01R 13/516* (2013.01); *H01R 13/73* (2013.01); *H05K 5/0073* (2013.01); *H01R 2201/06* (2013.01); *H05K 5/0052* (2013.01)

(58) Field of Classification Search
   CPC .... G06F 1/1628; G06F 1/1656; G06F 1/1613; G06F 1/16; H05K 5/0073; H05K 5/0052; H01R 13/516; H01R 13/73; H01R 2201/06
   USPC ...................................................... 361/679.32
   See application file for complete search history.

(56) References Cited

U.S. PATENT DOCUMENTS

| | | |
|---|---|---|
| 5,348,347 A | 9/1994 | Shink |
| 5,632,373 A | 5/1997 | Kumar et al. |
| 5,808,865 A | 9/1998 | Alves |
| 5,835,344 A | 11/1998 | Alexander |
| 6,052,279 A * | 4/2000 | Friend .................. G06F 1/1626 361/679.32 |

(Continued)

OTHER PUBLICATIONS

International Search Report and Written Opinion issued in International Application No. PCT/US21/28152 dated Jul. 27, 2021 (12 pages).

(Continued)

*Primary Examiner* — Anatoly Vortman
*Assistant Examiner* — Zhengfu J Feng
(74) *Attorney, Agent, or Firm* — Rothwell, Figg, Ernst & Manbeck, P.C.

(57) ABSTRACT

A case for use with a portable computing device is provided. The case comprises a housing for protecting the portable computing device. The housing is configured to attach to the portable computing device. The case further comprises a multiport hub and/or a data storage device contained within the housing. The multiport hub is configured to be electrically connected to the portable computing device.

16 Claims, 7 Drawing Sheets

(56) References Cited

U.S. PATENT DOCUMENTS

| | | | |
|---|---|---|---|
| 6,269,948 B1 | 8/2001 | Jackson | |
| 6,532,152 B1* | 3/2003 | White | G02F 1/133308 |
| | | | 361/692 |
| 8,373,980 B2* | 2/2013 | Reber | G06F 1/1632 |
| | | | 361/679.3 |
| 8,531,834 B2* | 9/2013 | Rayner | H04B 1/3888 |
| | | | 361/679.56 |
| 8,567,578 B2 | 10/2013 | Cuong et al. | |
| 8,763,795 B1 | 7/2014 | Oten et al. | |
| 8,775,710 B1* | 7/2014 | Miller | G06F 1/1632 |
| | | | 710/303 |
| 10,159,320 B2* | 12/2018 | Armstrong | H04B 1/3888 |
| 2003/0063196 A1* | 4/2003 | Palatov | H04N 5/765 |
| | | | 348/211.2 |
| 2006/0226040 A1 | 10/2006 | Medina | |
| 2006/0268499 A1* | 11/2006 | Chan | G06F 1/1656 |
| | | | 361/679.4 |
| 2006/0274493 A1* | 12/2006 | Richardson | H05K 5/068 |
| | | | 361/679.4 |
| 2007/0119735 A1 | 5/2007 | Moser | |
| 2008/0202959 A1 | 8/2008 | Chu | |
| 2010/0044259 A1* | 2/2010 | Wang | A45C 13/30 |
| | | | 206/320 |
| 2011/0119686 A1* | 5/2011 | Chen | G06F 3/0632 |
| | | | 719/326 |
| 2014/0152890 A1* | 6/2014 | Rayner | H04N 5/2252 |
| | | | 348/376 |
| 2015/0338885 A1* | 11/2015 | Hoobler | G06F 1/1626 |
| | | | 224/191 |
| 2017/0068272 A1 | 3/2017 | Loscalzo | |
| 2017/0220070 A1 | 8/2017 | Clark | |
| 2018/0188588 A1* | 7/2018 | Ho | G02F 1/133308 |
| 2018/0224892 A1 | 8/2018 | Belfiglio | |
| 2019/0133280 A1* | 5/2019 | Gordon | A45C 11/00 |

OTHER PUBLICATIONS

Non-Final Office Action issued in U.S. Application No. 16/821,113 dated Apr. 11, 2022 (10 pages).

* cited by examiner

CASE FOR PORTABLE COMPUTING DEVICES

CROSS-REFERENCE TO RELATED APPLICATIONS

This application claims the benefit of U.S. provisional patent application No. 63/016,480 filed on Apr. 28, 2020; this application is also a continuation in part of U.S. patent application Ser. No. 16/821,113, filed on Mar. 17, 2020 (published as US 20200401511 on Dec. 24, 2020), which claims the benefit of i) U.S. provisional patent application No. 62/796,099, filed on Jan. 24, 2019 and ii) U.S. provisional patent application No. 62/854,365, filed on May 30, 2019. The above identified applications and publication are incorporated by this reference herein.

TECHNICAL FIELD

This disclosure relates to the technical field of computer peripheral devices. More particularly, the disclosure is in the technical field of attachable computer peripheral devices that host various computer device connection ports, both input and output, that allows for the connection of multiple computer peripherals into the connected host device.

This disclosure also relates to the technical field of data storage. More particularly, the disclosure relates to integrating data storage into a case providing protection for computing devices such as laptops and/or tablets.

BACKGROUND

External multiport hubs currently depend on a means of connection with a computer through a cable and into the computer port allowing an easy unwanted disconnection. This peripheral is prone to unwanted disconnections, which can disconnect the connected peripherals and/or devices and result in a loss of current work/data (depending on the connected device), and/or cause a disturbance on the workflow of the user. Current external multiport hubs are non-attachable and therefore prone to loss and breakage.

Also, external hard drives (e.g., solid-state drives) (or "drive" for short) currently depend on a means of connection with a laptop solely through a cable. This temporary fixture is prone to unwanted disconnections, which can damage data on the drive, and result in a loss of any work being completed via the hard drive during operation.

SUMMARY

Accordingly, in one aspect there is provided a case attachable to a portable computing device (e.g., a laptop, a tablet, a mobile phone, a PDA, etc.), where the case houses a multiport hub device and/or a data storage device, thereby providing protection for the computer and simultaneously allowing for multiple additional peripherals to be connected to the computer and/or providing additional data storage through robust cable routing and managing between the integrated multiport hub and/or data storage device embedded in the case and the portable computing device. In some embodiments, the case has a housing that has an exterior shell and is reinforced via an additionally integrated reinforcement. The exterior shell may be constructed of any suitable material using any suitable process. For example, the exterior shell may be constructed of an injection molded polymer. In another example, the exterior shell may be constructed of aluminum using one or more processes such as stamping, casting, forging, milling, etc.

The case may be attached to the portable computing device using different attaching mechanisms. For example, the case may utilize snap fittings to procure the semi-permanent fitting to the portable computing device, thus producing a protective effect for the contained portable computing device. In another example, adhesive may be used to attach the case to the portable computing device. The integrated multiport hub and/or data storage device is contained within an interior space of the housing, which is generated between the interior reinforcement and exterior shell, whilst access is available through a connective port.

Accordingly, embodiments of this disclosure provide an attachable, protective, hard-shell portable computing device case, with an integrated multiport hub hosting various ports for different computer applications.

By integrating a multi-port hub within a hard-shell case, the embodiments provide a snap fit between the case and the portable computing device whilst simultaneously providing a protective enclosure for the featured multi-port hub, therefore significantly reducing the risk of detachment during use, also resulting in protection from any physical damage for the contained portable computing device.

One objective of some embodiments is to provide multiple solutions in one attachable case which is more affordable (than the components sold as separate products.)

Another objective of some embodiments is to describe a peripheral device which replaces current plug-in computer peripherals, with one being integrated in an attachable case or device.

Additionally or alternatively, in one aspect, this disclosure overcomes the above disadvantage by providing a case for laptop where the case includes a data storage device (a.k.a., "data storage drive" or "drive" for short), and allows for more robust cable routing and management between the drive and the laptop. In one embodiments, the case is reinforced via an additionally integrated reinforcement, and utilizes different attaching mechanism (e.g., snap fittings to procure the semi-permanent fitting and/or adhesive), thus producing a protective effect for the contained laptop. The case may be made of any suitable material using any suitable process. For example, the case may be made of an injection molded polymer. In another example, the case may be made of aluminum using one or more processes such as stamping, casting, forging, milling, etc. The integrated drive is contained within a space generated between interior reinforcement and exterior polymer shell, whilst access is available through a connective data port.

Accordingly, in one embodiment there is provide a protective hard-shell laptop case with integrated data storage device (e.g., a solid-state data storage device or other type of data storage device).

By integrating a data storage device within a case, the invention provides a snap fit between the case and the laptop whilst simultaneously providing a protective enclosure for the featured data storage device, therefore significantly reducing the risk of detachment during use, resulting in a protection from physical damage for the contained laptop.

BRIEF DESCRIPTION OF THE DRAWINGS

Some embodiments of the present invention are illustrated as an example and are not limited by figures of the accompanying drawings, in which references may indicate similar elements and in which.

DETAILED DESCRIPTION OF THE INVENTION

Embodiment 1

Figure 1:
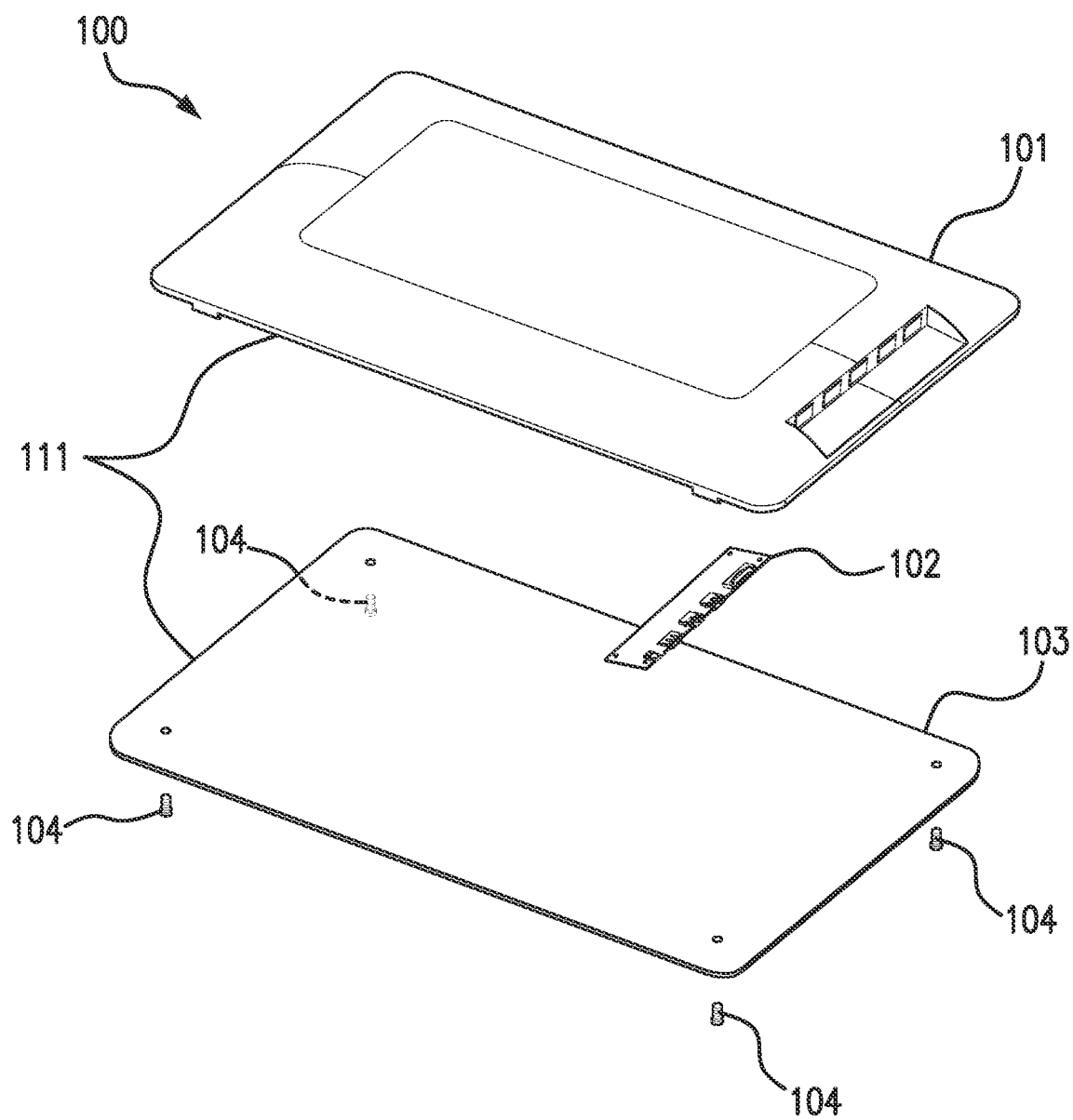
FIG. 1 depicts an exploded perspective view of a case according to one embodiment.

FIG. 1 shows a case 100 according to one embodiment. The case 100 may comprise a housing 111 that houses an integrated multiport hub 102. The housing 111 may comprise an exterior shell 101 and a lower housing member 103 (a.k.a., internal reinforcement 103). Fixtures 104 are used to physically connect the internal reinforcement 103 to the exterior shell 101.

Figure 3:
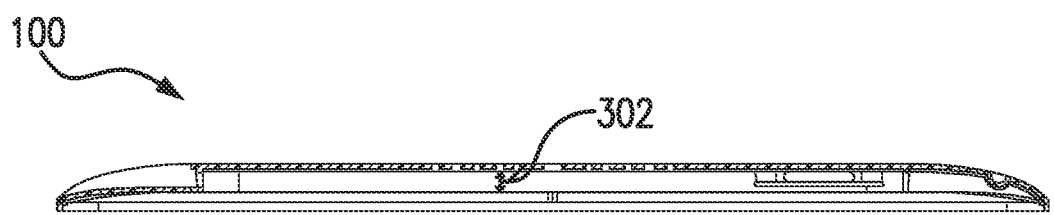
FIG. 3 is a side view cross section of the case.

The exterior shell 101 and the lower housing member 103 may fit together to provide a space (gap) 302 (shown in FIG. 3) for the containment of the integrated multiport hub 102. The exterior shell 101 and the lower housing member 103 are secured in place by the fixtures 104. The space 302 is configured to fit the integrated multiport hub 102. Disposing the hub 102 into the generally enclosed space 302 prevents entry of contaminants, e.g., grit, dust, dirt et. al, from reaching the integrated multiport hub 102.

Figure 5A:
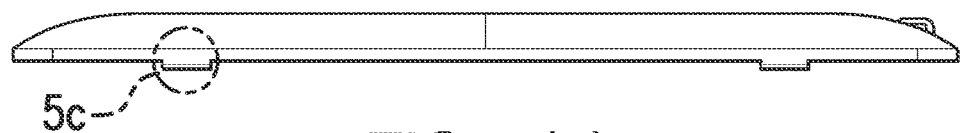
FIGS. 5(a) and 5(b) are cross sectional views highlighting the interaction between the case 100 and the portable computing device.
Figure 5B:
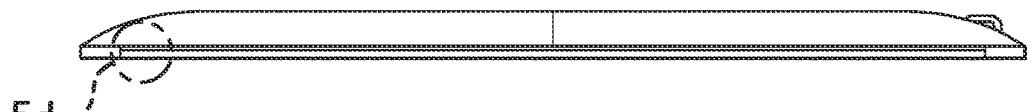
Figure 5C:
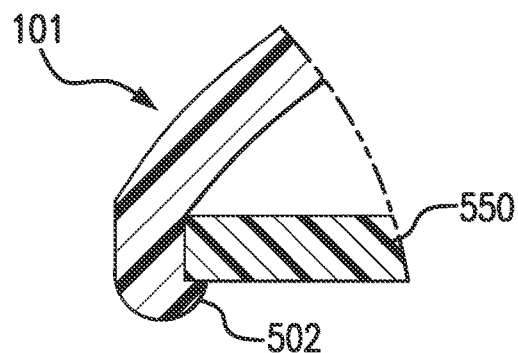
FIGS. 5(c) and 5(d) are enlarged views of portions of the cross sectional views shown in FIGS. 5(a) and 5(b).
Figure 5D:
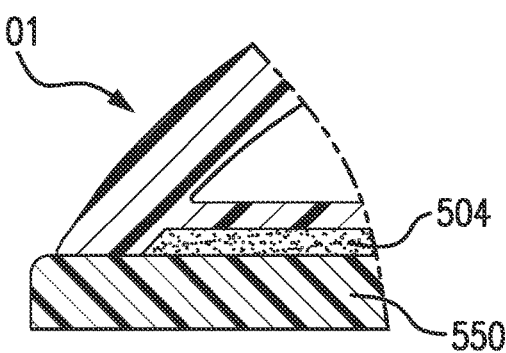

The case 100 may be secured in place to a user' device 550 by using different attachment mechanisms. For example, the case 100 may be secured to the device 550 by using snap fittings 502 as shown in FIGS. 5(a) and 5(c). The exterior shell 101 and the lower housing member 103 may be held together using insertable fittings such as the fixtures 104. The housing 111 including the snap fittings 502 allows for the secure fit of the case 100 on the electronic device 550 (e.g., a portable computing device, a tablet, or any electronic device), whilst simultaneously producing an attachable enclosure for the multiport hub 102, which is integrated by, and within the housing 111 shown in FIG. 1. Another mechanism 504 for attaching the case 100 to the portable computing device 550 is shown in FIGS. 5(b) and 5(d). The mechanism 504 may comprise the double-sided adhesive that may be used for attaching the housing 111 to the portable computing device 550.

Figure 2:
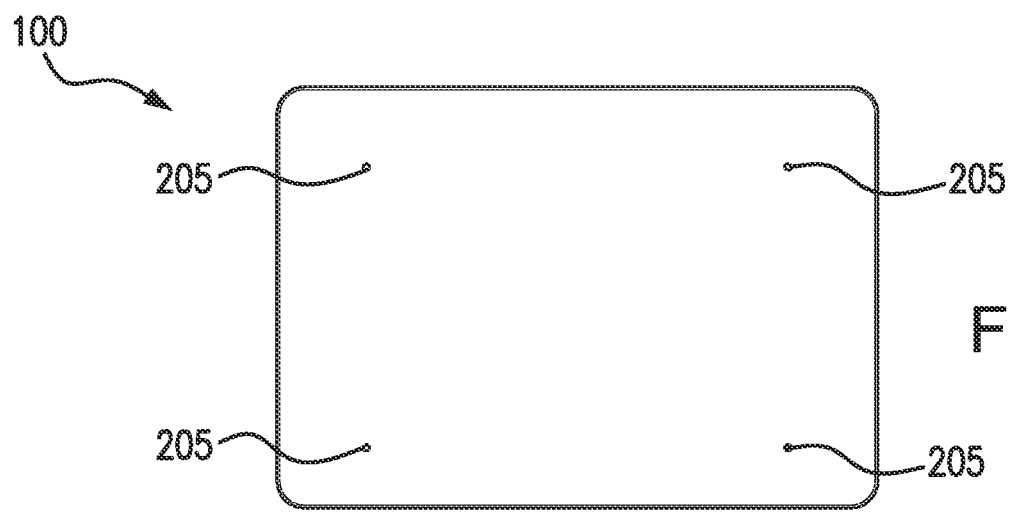
FIG. 2 is a bottom up view of the case.
Figure 4A:
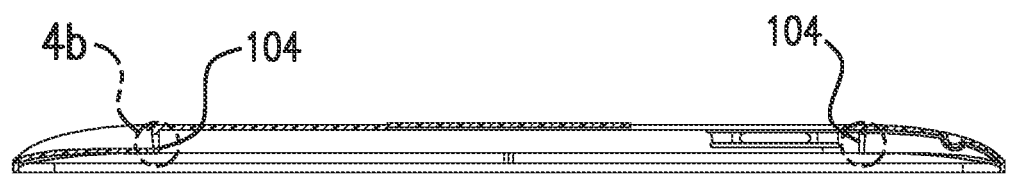
FIG. 4(a) is a side view cross section of the case, highlighting the manner in which a lower housing member (i.e., the internal reinforcement) is attached to the exterior shell via the fixtures.
Figure 4B:
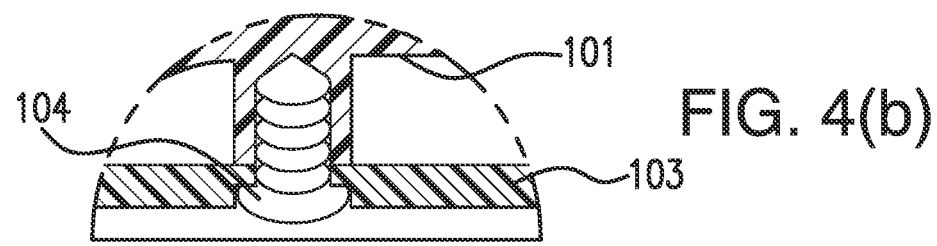
FIG. 4(b) is an enlarged view of a portion of the case shown in FIG. 4(a).

FIG. 2 shows a bottom up view of the case 100. FIG. 2 shows holes 205 provided in the case 100. The holes 205 provide a space for the insertion of the fixtures 104, which hold the lower housing member 103 and subsequently the multiport hub 102 within the case 100. The fixtures 104 may provide supports that provide an even pressure distribution between the portable computing device 550 and the case 100. FIGS. 4(a) and 4(b) show how the fixtures 104 secure the exterior shell 101 and the lower housing member 103 together.

With the thicker fitting head, when assembled, the fixtures 104 ensure that the portable computing device 550 itself does not come into direct contact with the interior of the case 100. Furthermore, the lower edge of housing 111 features molded tabs acting as snap fittings 502, whereby a portable computing device can be semi-permanently attached and held within the case 100, as shown in FIGS. 5(a) and 5(b). Using the fixtures 104, attaching the lower housing member 103 to the exterior shell 101 that includes the snap fittings 402 serves a dual purpose—holding the multiport hub 102 within the housing 111 and providing a hold between the case 100 and portable computing device.

Figure 6A:
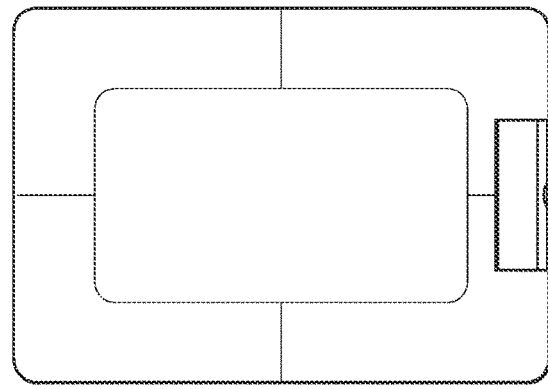
FIG. 6(a) is a top view of the case.
Figure 6B:
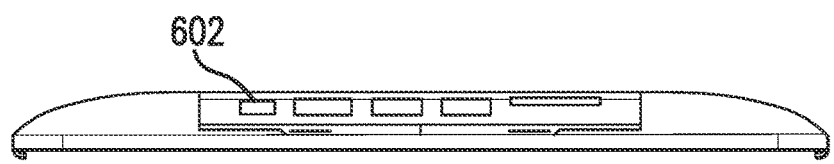
FIG. 6(b) is a side view of the case.

The connection between the portable computing device 550 and the multiport hub 102 may be achieved through the use of an additional cable. This cable can be attached to the case 100 through a provided slot 602 shown in FIGS. 6(a) and 6(b), which is designed to fit the female port on the multiport hub 102.

Figure 7:
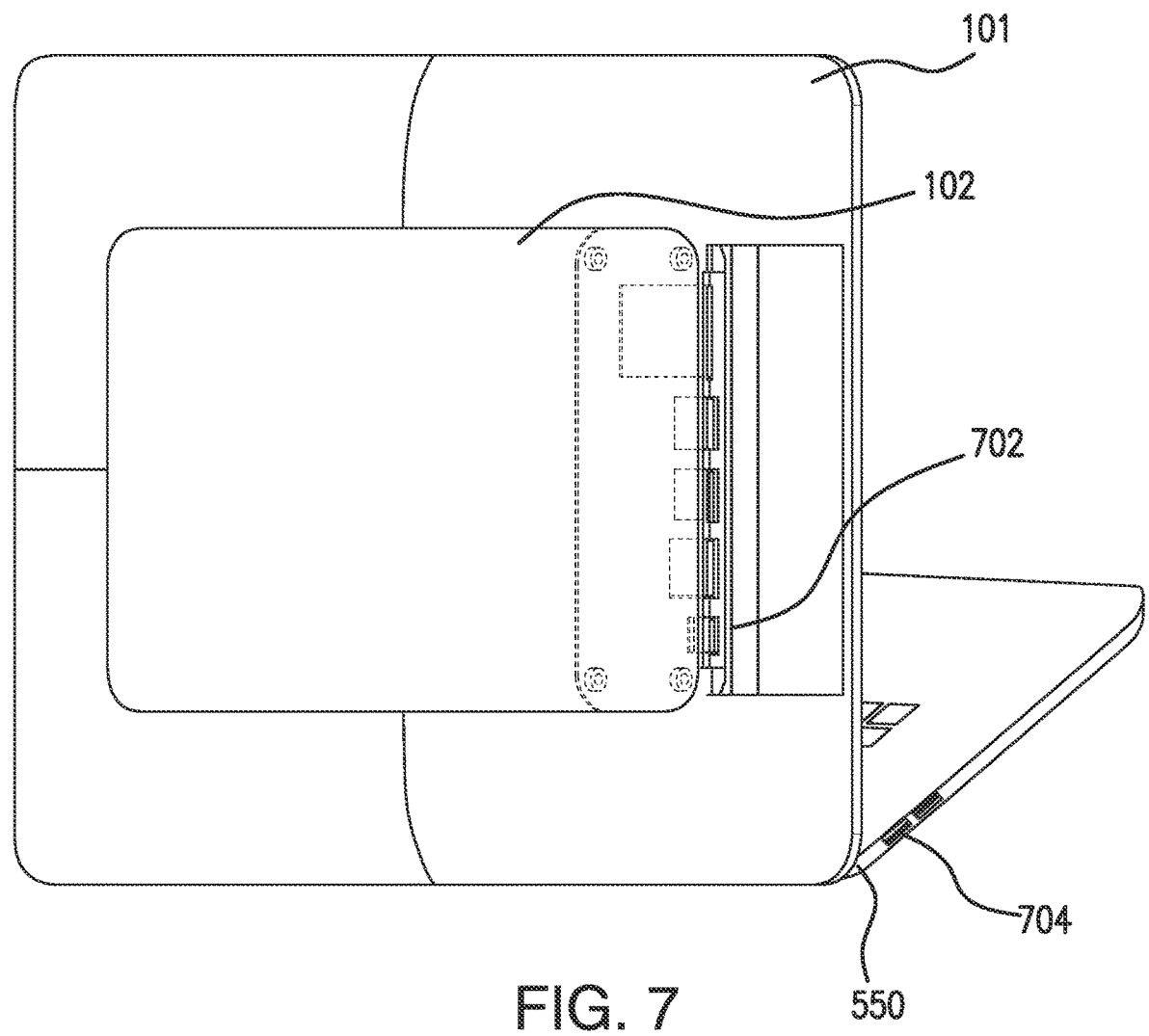
FIG. 7 is a front perspective view of the case installed on the portable computing device.

FIG. 7 shows a front view of the case 100 (which includes the exterior shell 101) while being attached to the portable computing device 550 which is open. The cable may be attached to the case 100 at the female port 702 of the multiport hub 102. The cable can be attached to the portable computing device 550 using any desired compatible port such as a port 704 shown in FIG. 7.

The multiport hub 102 may be disposed in the housing 111 in a way that the multiport hub 102 is accessible.

The advantages of the embodiments of this disclosure include, without limitation, the amalgamation of product and portable computing device, hence preserving the portability of personal computers whilst concurrently combining the convenience of various external ports and simultaneously have physical protection for the portable computing device. Furthermore, the connection between the multiport hub and the portable computing device is reliably secure as a result of the semi-permanent fixing between the portable computing device and the product. Connective data and display cables utilize the robust connection.

Embodiment 2

Figure 8:
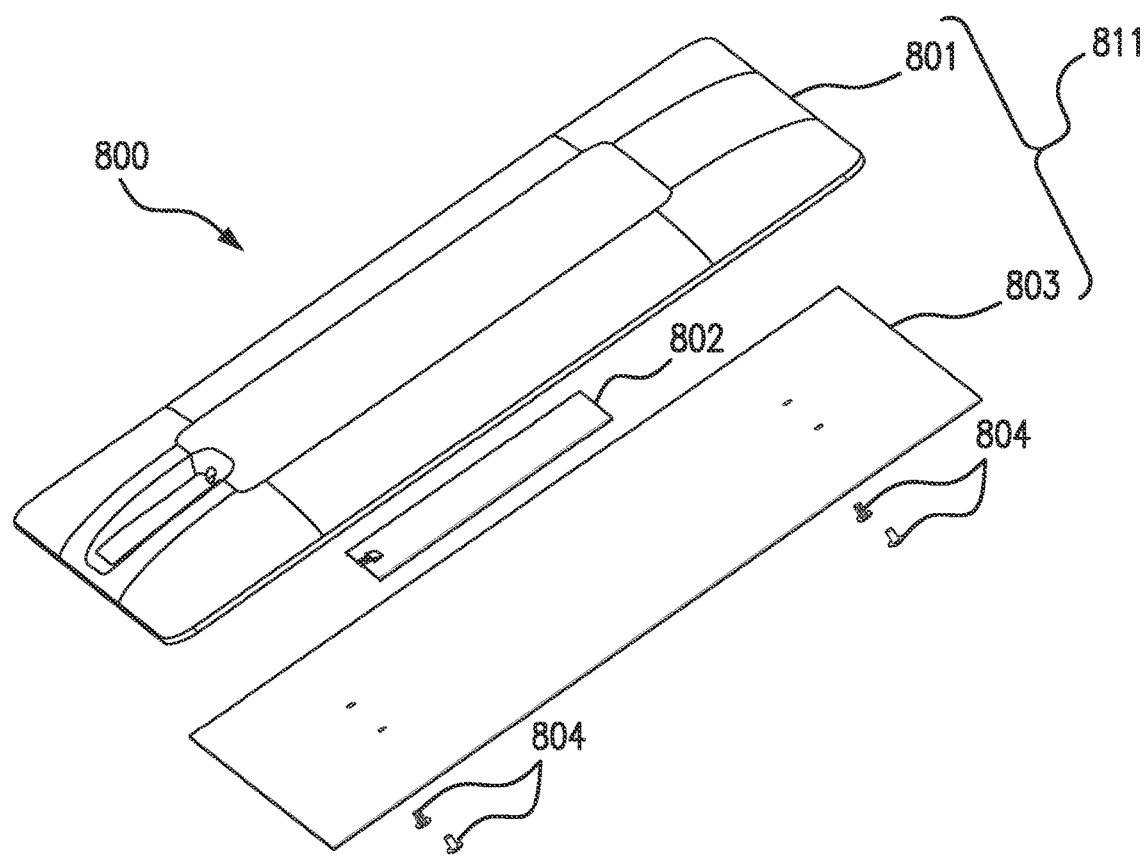
FIG. 8 depicts an exploded perspective view of a case according to one embodiment.

According to another embodiment, a case 800 is provided. As shown in FIG. 8, the case 800 may comprise a housing 811 that houses a data storage device 802. The housing 811 may comprise an exterior shell 801 and a lower housing member 803 (a.k.a., internal reinforcement 803). Fixtures 804 are used to physically connect the internal reinforcement 803 to the exterior shell 801.

Figure 10:
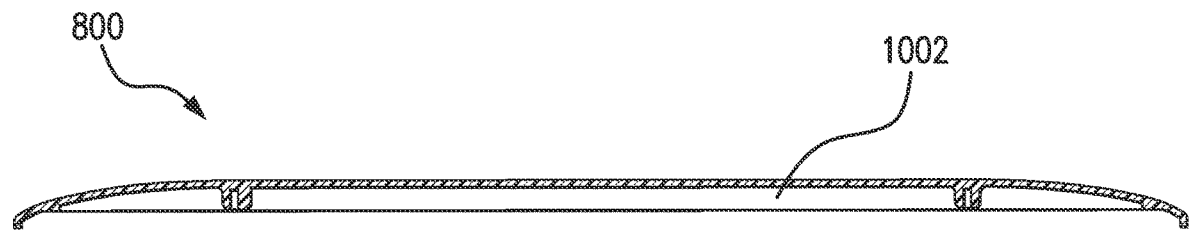
FIG. 10 is a side view of the cross section of the case.

The exterior shell 801 and the lower housing member 803 may fit together to provide a space 1002 shown in FIG. 10 for the containment of data storage device 802 (e.g., a printed circuit board with a solid-stage storage chip). The exterior shell 801 and the lower housing member 803 are secured in place by the fixtures 804. The space 1002 is for fitting the data storage device 802 inside the housing 811. By disposing the data storage device 802 inside the case 811, the housing 811 prevents embedment of contaminants, e.g. grit, dust, dirt et. al, from reaching the data storage device 802.

The case 800 is secured to a portable computing device (e.g., a laptop) 1206 by integrated snap fittings 1202 shown in FIG. 12. The housing 811 including the snap fittings 1202 allows for the secure fit of a laptop whilst simultaneously producing a semi-permanent fixing for the storage device, which is integrated by, and within, the case 800.

Figure 9:
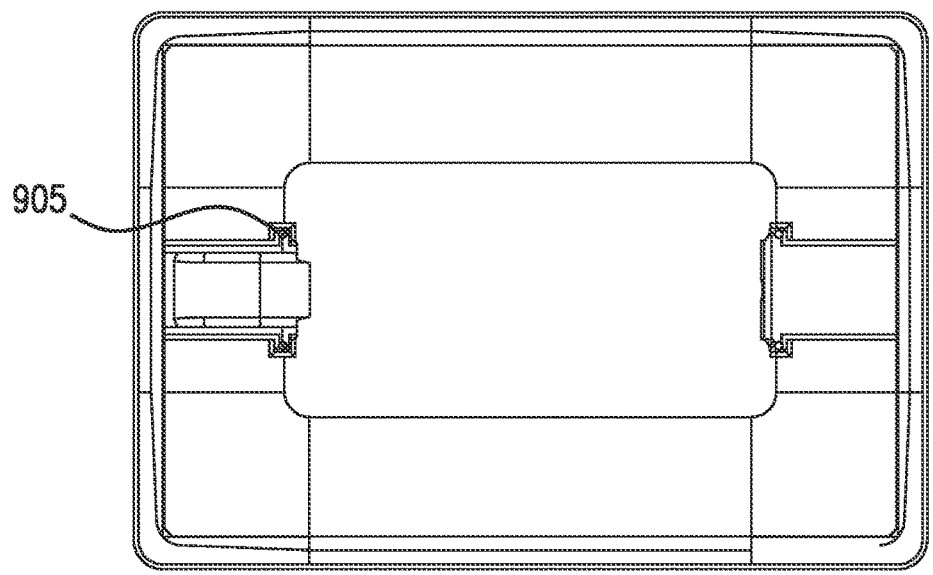
FIG. 9 is a bottom up view of the case.

FIG. 9 shows a top down wireframe view of the case 800. In FIG. 9, holes 905 are shown. The holes 905 provide a space for the insertion of the fixtures 804. Inserting the fixtures 804 into the holes 905 allows holding the lower housing member 803 and subsequently the on-board storage (e.g., a storage drive) within the case 800.

Figure 11A:
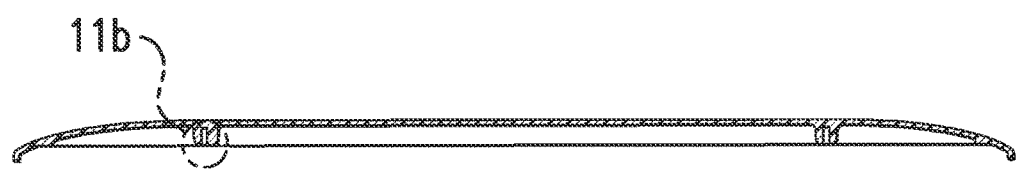
FIG. 11(a) is a side view of the cross section of the case highlighting the manner in which a lower housing member is attached to the exterior shell via the fixtures.
Figure 11B:
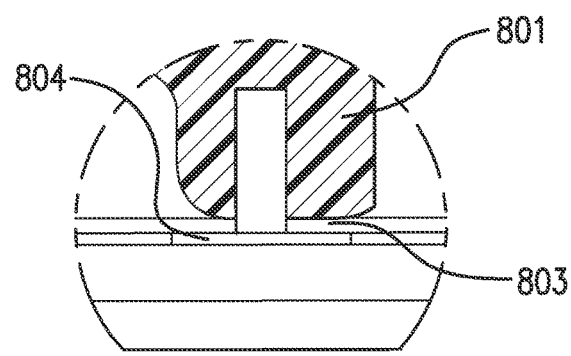
FIG. 11(b) is an enlarged view of a portion of the cross section shown in FIG. 11(a).
Figure 12A:
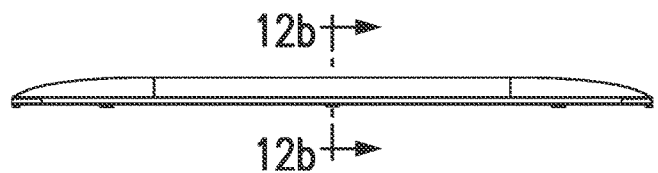
FIGS. 12(a)-(c) are views highlighting the snap fit interaction between the case and the laptop.
Figure 12B:
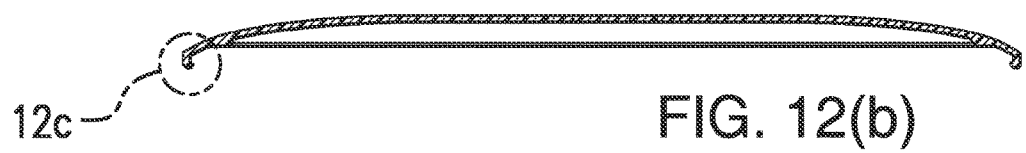
Figure 12C:
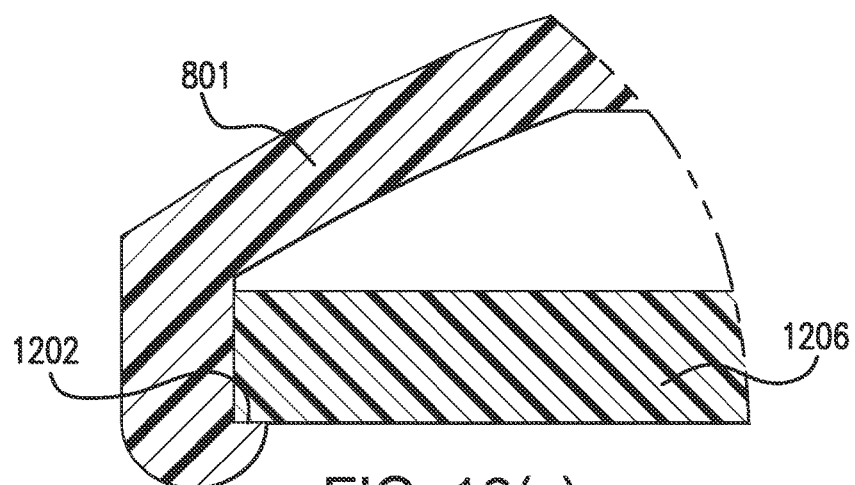

FIGS. 11(a) and 11(b) show how the fixtures 804 secure the exterior shell 801 and the lower housing member 803 together. The fixtures 804 may provide support that ensures an even pressure distribution in the high tolerance fitting of the laptop's distribution in the semi-permanent fitting between the laptop 1206 and the case 800. The lower housing member 803 ensures that the laptop 1206 itself does not come into direct contact with the components included inside the case 800. The case 800 may be attached to the laptop 1206 using any suitable attaching mechanisms. For example, the lower edge of the housing 811 may feature molded tabs acting as the snap fittings 1202, whereby a laptop can be semi-permanently attached and held within the case 800, as shown in FIGS. 12(a)-(c). Attaching the lower housing member 803 to the exterior shell 801 that includes the snap fittings 1202 serves a dual purpose—holding the data storage within and providing a hold between the housing 811 and the laptop 1206.

Figure 13A:
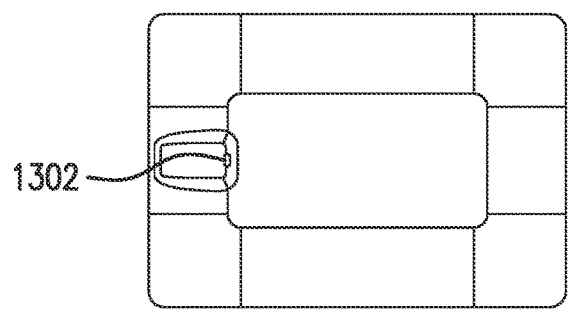
FIG. 13(a) is a top view of the case including the slot provided for access to data port.
Figure 13B:
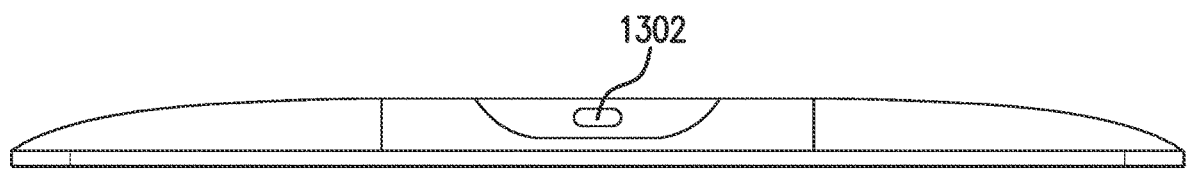
FIG. 13(b) is a side view of the case including the slot provided for access to data port.

The data connection between the laptop 1206 and the case 800 may be achieved through the use of a cable. This cable can be attached to the on-board storage included in the case 800 through a provided slot 1032 of the housing 811 shown in FIG. 13, which is designed to fit a connection port (e.g., a female USB-C port). The connection port may be included in the data storage device 802. The data storage device 802 may be mounted on the interior of the lower housing member 803 in a way that allows directly fitting the connection port of the data storage device 802 to the slot 1302 of the housing 811.

The advantages of the embodiments include, without limitation, the amalgamation of product and laptop, hence preserving the portability of personal computers whilst concurrently combining the convenience of external storage and physical protection for the laptop. Furthermore, the connection between storage drive and laptop is reliably secure as a result of the semi-permanent fixing between the laptop and the product. Connective data cables utilize the robust USB-C connection.

In some embodiments, the aforementioned first and second embodiments may be combined. For example, in addition to the housing 111 containing the integrated multiport hub 102, the housing 111 may also contain the data storage device 802. In another example, in addition to the housing 811 containing the data storage device 802, the housing 811 may also contain the integrated multiport hub 102.

While various embodiments are described herein, it should be understood that they have been presented by way of example only, and not limitation. Thus, the breadth and scope of this disclosure should not be limited by any of the above-described exemplary embodiments. Moreover, any combination of the above-described elements in all possible variations thereof is encompassed by the disclosure unless otherwise indicated herein or otherwise clearly contradicted by context.

The invention claimed is:

1. A case for use with a portable computing device including an upper portion and a lower portion, the case comprising:
   a housing for protecting the portable computing device, wherein the housing is configured to attach directly to the upper portion of the portable computing device but not to the lower portion of the portable computing device; and
   a multiport hub contained within the housing, wherein the multiport hub is configured to be electrically connected to the portable computing device, wherein
   the housing comprises an exterior shell and a lower housing member,
   the exterior shell comprises a first protruding member projecting away from an inner surface of the exterior shell and a second protruding member projecting away from the inner surface of the exterior shell,
   each of the first protruding member and the second protruding member is configured to abut the lower housing member,
   the first protruding member comprises a first cavity,
   the second protruding member comprises a second cavity,
   the lower housing member comprises a first hole and a second hole,
   the first hole is aligned with the first cavity,
   the second hole is aligned with the second cavity, and
   the exterior shell and the lower housing member are coupled to each other using a first fixture inserted into the first cavity via the first hole and a second fixture inserted into the second cavity via the second hole.

2. The case of claim 1, wherein
   a space is bounded by the first and second protruding members between the exterior shell and the lower housing member, and
   the multiport hub is disposed in the space.

3. The case of claim 1, wherein the multiport hub comprises a first port which is of a first type and a second port which is of a second type.

4. The case of claim 3, wherein
   the first port is configured to be electrically connected to the portable computing device,
   the second port is configured to be electrically connected to an external device, and
   the first and second ports are configured to allow the portable computing device to transmit data to and/or receive data from the external device.

5. The case of claim 1, further comprising:
   a data storage contained within the space bounded by the first and second protruding members; and
   an electrical port for connecting the data storage to the portable computing device, wherein the electrical port is configured to allow the portable computing device to transmit data to and/or receive data from the data storage, wherein
   the electrical port is disposed within an opening of the case such that the electrical port is accessible from outside of the case.

6. The case of claim 5, wherein
   the multiport hub comprises a first port which is of a first type and a second port which is of a second type, the first port is configured to be electrically connected to the portable computing device, the second port is configured to be electrically connected to an external device, the first and second ports are configured to allow the portable computing device to transmit data to and/or receive data from the external device, and the first port is the electrical port.

7. The case of claim 1, wherein the housing comprises a connecting part configured to couple the housing to an exterior housing of the portable computing device.

8. The case of claim 7, wherein the exterior housing of the portable computing device comprises a first side, a second side opposite the first side, and a third side disposed between the first side and the second side, the case is configured to cover the first side, the connecting part of the case comprises a first connecting sub-part and a second connecting sub-part, the first connecting sub-part is configured to abut the second side of the exterior housing of the portable computing device, and the second connecting sub-part is configured to abut the third side of the exterior housing of the portable computing device, thereby holding the exterior housing of the portable computing device within the housing.

9. The case of claim 7, wherein the housing comprises a first edge portion and a second edge portion, a connecting space is bounded by the first edge portion and the second edge portion, the connecting part fills up the connecting space such that the thickness of the connecting part is substantially same as the thickness of the connecting space, the connecting part comprises an adhesive disposed on a side of the housing, and the adhesive is configured to connect the exterior housing to the housing.

10. The case of claim 1, wherein the portable computing device is a laptop.

11. A case for use with a portable computing device including an upper portion and a lower portion, the case comprising:

a housing for protecting the portable computing device, wherein the housing is configured to attach directly to the upper portion of the portable computing device but not to the lower portion of the portable computing device;

a data storage device contained within the housing; and an electrical connector for connecting the data storage device to processing circuitry within the portable computing device, wherein the housing comprises an exterior shell and a lower housing member, the exterior shell comprises a first protruding member projecting away from an inner surface of the exterior shell and a second protruding member projecting away from the inner surface of the exterior shell, each of the first protruding member and the second protruding member is configured to abut the lower housing member, the first protruding member comprises a first cavity, the second protruding member comprises a second cavity, the lower housing member comprises a first hole and a second hole, the first hole is aligned with the first cavity, the second hole is aligned with the second cavity, and the exterior shell and the lower housing member are coupled to each other using a first fixture inserted into the first cavity via the first hole and a second fixture inserted into the second cavity via the second hole.

12. The case of claim 1, wherein the upper portion of the portable computing device comprises an exterior side and an interior side opposite to the exterior side, and the housing comprises a means for coupling the housing to the exterior side of the upper portion of the portable computing device.

13. The case of claim 11, wherein the upper portion of the portable computing device comprises an exterior side and an interior side opposite to the exterior side, and the housing comprises a means for coupling the housing to the exterior side of the upper portion of the portable computing device.

14. The case of claim 1, wherein the upper portion of the portable computing device comprises an exterior side and an interior side opposite to the exterior side, and the case is configured to be disposed on the exterior side only.

15. The case of claim 11, wherein the upper portion of the portable computing device comprises an exterior side and an interior side opposite to the exterior side, and the case is configured to be disposed on the exterior side only.

16. The case of claim 11, wherein the housing comprises a connecting part configured to couple the housing to an exterior housing of the portable computing device, the housing comprises a first edge portion and a second edge portion, a connecting space is bounded by the first edge portion and the second edge portion, the connecting part fills up the connecting space such that the thickness of the connecting part is substantially same as the thickness of the connecting space, the connecting part comprises an adhesive disposed on a side of the housing, and the adhesive is configured to connect the exterior housing to the housing.

* * * * *